United States Patent
Yin et al.

(10) Patent No.: US 10,332,917 B2
(45) Date of Patent: Jun. 25, 2019

(54) PIXEL UNIT AND METHOD FOR PRODUCING THE SAME, ARRAY SUBSTRATE AND DISPLAY APPARATUS

(71) Applicants: BOE Technology Group Co., Ltd., Beijing (CN); Hefei BOE Optoelectronics Technology Co., Ltd., Anhui (CN)

(72) Inventors: Xiaobin Yin, Beijing (CN); Chuanbao Chen, Beijing (CN); Dongling Sun, Beijing (CN); Lisen Wang, Beijing (CN)

(73) Assignees: BOE TECHNOLOGY CROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 57 days.

(21) Appl. No.: 15/105,032

(22) PCT Filed: Aug. 31, 2015

(86) PCT No.: PCT/CN2015/088509
§ 371 (c)(1),
(2) Date: Jun. 16, 2016

(87) PCT Pub. No.: WO2016/165264
PCT Pub. Date: Oct. 20, 2016

(65) Prior Publication Data
US 2017/0141132 A1 May 18, 2017

(30) Foreign Application Priority Data
Apr. 13, 2015 (CN) .......................... 2015 1 0173322

(51) Int. Cl.
*G02F 1/136* (2006.01)
*H01L 27/12* (2006.01)
(Continued)

(52) U.S. Cl.
CPC ........ *H01L 27/1244* (2013.01); *G02F 1/1368* (2013.01); *G02F 1/13439* (2013.01);
(Continued)

(58) Field of Classification Search
CPC ...................... H01L 27/3223; G02F 1/136227
See application file for complete search history.

(56) References Cited

U.S. PATENT DOCUMENTS

2001/0004273 A1*  6/2001  Sugimoto ........... G02F 1/13458
                                                349/43
2005/0019969 A1   1/2005  Chang et al.
(Continued)

FOREIGN PATENT DOCUMENTS

CN   101344697 A   1/2009
CN   101408820 A   4/2009
(Continued)

OTHER PUBLICATIONS

First Office Action, including Search Report, for Chinese Patent Application No. 201510173322.0, dated May 4, 2017, 17 pages.
(Continued)

*Primary Examiner* — Alexander P Gross
(74) *Attorney, Agent, or Firm* — Westman, Champlin & Koehler, P.A.

(57) ABSTRACT

The present disclosure provides a pixel unit and a method for producing the same, an array substrate and a display apparatus. The pixel unit includes: a thin film transistor; an insulation layer formed at least on a drain electrode of the thin film transistor and formed therein with a via hole which extends through the insulation layer to expose the drain
(Continued)

electrode of the thin film transistor below the insulation layer; a pixel electrode formed on the insulation layer and electrically connected to the drain electrode of the thin film transistor at the via hole; and at least one elevating layer formed below the via hole and located below a part of the drain electrode exposed from the via hole such that the exposed part has a height greater than the height of the parts of the drain electrode adjacent to the exposed part. The depth and slope of the via hole is reduced by adding the elevating layer below the via hole. The elevating layer may be made from the gate metal layer and/or the active layer that are not etched off in process without increasing any production cost and process difficulty.

13 Claims, 3 Drawing Sheets

(51) Int. Cl.
H01L 27/32 (2006.01)
G02F 1/1333 (2006.01)
G02F 1/1343 (2006.01)
G02F 1/1362 (2006.01)
G02F 1/1368 (2006.01)
H01L 29/417 (2006.01)
H01L 29/786 (2006.01)

(52) U.S. Cl.
CPC .. G02F 1/133345 (2013.01); G02F 1/134309 (2013.01); G02F 1/136227 (2013.01); G02F 1/136286 (2013.01); H01L 27/1222 (2013.01); H01L 27/1248 (2013.01); H01L 27/3248 (2013.01); H01L 29/41733 (2013.01); H01L 29/78606 (2013.01); H01L 29/78618 (2013.01); *G02F 2001/13606* (2013.01); *G02F 2201/121* (2013.01); *G02F 2201/123* (2013.01); *H01L 27/3223* (2013.01); *H01L 27/3262* (2013.01)

(56) References Cited

U.S. PATENT DOCUMENTS

| 2010/0237348 | A1 | 9/2010 | Tseng et al. |
| 2011/0032460 | A1* | 2/2011 | Lee .................. G02F 1/133555 349/114 |
| 2012/0184060 | A1* | 7/2012 | Song .................. H01L 27/1214 438/34 |
| 2014/0306229 | A1 | 10/2014 | Ono |
| 2015/0279262 | A1* | 10/2015 | Tsai ..................... G09G 3/2003 345/88 |

FOREIGN PATENT DOCUMENTS

| CN | 101963729 A | 2/2011 |
| CN | 102346340 A | 2/2012 |
| CN | 103107135 A | 5/2013 |
| CN | 104867939 A | 8/2015 |
| WO | 2014/089925 A1 | 6/2014 |

OTHER PUBLICATIONS

International Search Report and Written Opinion for International Application No. PCT/CN2015/088509, dated Jan. 18, 2016, 10 pages.
English translation of Box No. V of the Written Opinion of the International Searching Authority for International Application No. PCT/CN2015/088509, dated Jan. 18, 2016, 2 pages.
Second Office Action for Chinese Patent Application No. 201510173322.0, dated Jan. 24, 2018, 16 pages.
Extended European search report, pursuant to Rule 62 EPC, for European Patent Application No. 15866400.3, dated Nov. 12, 2018, 12 pages.

\* cited by examiner

PIXEL UNIT AND METHOD FOR PRODUCING THE SAME, ARRAY SUBSTRATE AND DISPLAY APPARATUS

CROSS-REFERENCE TO RELATED APPLICATION

This application is a Section 371 National Stage Application of International Application No. PCT/CN2015/088509, filed on 31 Aug. 2015, entitled "PIXEL UNIT AND METHOD FOR PRODUCING THE SAME, ARRAY SUBSTRATE AND DISPLAY APPARATUS", which has not yet published, and which claims priority to Chinese Application No. 201510173322.0, filed on 13 Apr. 2015, incorporated herein by reference in their entirety.

BACKGROUND OF THE INVENTION

Field of the Invention

The present disclosure generally relates to the field of technology of liquid crystal display, and in particular, to a pixel unit and a method for producing the pixel unit, an array substrate and a display apparatus.

Description of the Related Art

A thin film transistor liquid crystal display (TFT-LCD for short), basically includes an array substrate and an opposite substrate. A space between the array substrate and the opposite substrate is filled with a liquid crystal layer, and the array substrate and the opposite substrate are assembled to form a liquid crystal cell structure.

FIG. 1 is a schematic cross-sectional view showing a pixel unit on an array substrate in the prior art. A plurality of pixel units are distributed on a base substrate 10 of the array substrate. As illustrated in FIG. 1, each of the pixel units includes a thin film transistor (TFT) 20, a pixel electrode 41 and a common electrode 43.

The thin film transistor 20 includes: a gate electrode 21, a gate insulation layer 22 formed on the gate electrode 21, an active layer 23 formed on the gate insulation layer 22, and a source electrode 24 and a drain electrode 25 formed on the active layer 23. Typically, the gate insulation layer 22 is made from materials such as $SiO_x$, $SiN_x$. The pixel electrode 41 and the common electrode 43 are typically made from an ITO material and are separated from each other by a passivation layer 42.

An organic layer 30, as an insulation layer, is provided between the pixel electrode 41 and the drain electrode 25. With the organic insulation layer, it can achieve a better insulation performance than an inorganic insulation layer (typically made from $SiN_x$), and may tend to form a thicker film layer. Generally, the $SiN_x$ insulation layer has a thickness of 0.2~0.6 μm, while the organic insulation layer may have a thickness of up to 2 μm. The greater the thickness of the insulation layer between the drain electrode 25 and the pixel electrode 41 is, the larger the distance between the pixel electrode 41 and the source electrode/drain electrode (24, 25) becomes, the smaller the formed coupling capacitance becomes, and the better the quality of displayed picture becomes.

In order to electrically connecting the pixel electrode 41 with the drain electrode 25 of the thin film transistor, it is desired to form a via hole 50 in the organic insulation layer.

However, as the organic insulation layer has a greater thickness, the via hole 50 has a great depth (up to 2 μm) and a large slope and thus the conductive materials overlapped on a side of the via hole may tend to be broken. In addition, the great depth and poor planarization of the via hole 50 may cause Rubbing Mura phenomenon (i.e., fine stripe-like defects formed on a panel due to an alignment film friction alignment process). Furthermore, so does it when thicker inorganic insulation layer is used.

In order to avoid the above circumstance, a method of directly reducing the slope of the via hole is used in the prior art. FIG. 2 schematically shows a structure of the pixel unit on the array substrate after the slope of the via hole is reduced in the prior art. As shown in FIG. 2, the above problem may be alleviated by regulating the slope of the via hole with process conditions. However, when the depth of the via hole is constant, if the slope of the via hole is reduced, the size of the via hole may be desired to increase, which needs sufficient large size of space at the via hole. In fact, as the pixel units are arranged closely and the via hole has a limited space size, it is very difficult to implement the method of reducing the slope of the via hole.

SUMMARY

Technical Problem to Be Solved

In view of the above problems, the present disclosure provides a pixel unit and a method for producing the same, an array substrate and a display apparatus, which enable reduction in the slope of the via hole at a low cost and high practicability.

Technical Solutions

In accordance with an aspect of the present disclosure, there is provided a pixel unit, including: a thin film transistor; an insulation layer, formed at least on a drain electrode of the thin film transistor, the insulation layer being formed therein with a via hole which extends through the insulation layer to expose the drain electrode of the thin film transistor below the insulation layer; a pixel electrode formed on the insulation layer and electrically connected to the drain electrode of the thin film transistor at the via hole; and at least one elevating layer formed below the via hole and located below a part of the drain electrode exposed from the via hole such that the exposed part has a height greater than the height of parts of the drain electrode adjacent to the exposed part.

In accordance with another aspect of the present disclosure, there is provided a method for producing a pixel unit, including: forming at least one elevating layer in a region below a predetermined via hole position of the pixel unit; producing a drain electrode of the thin film transistor, a part of the drain electrode being formed above the at least one elevating layer such that the part of the drain electrode has a height greater than that of parts of the drain electrode adjacent to the part; forming an insulation layer at least above the drain electrode of the thin film transistor and forming a via hole in the insulation layer at a position corresponding to the predetermined via hole position, the via hole extending through the insulation layer to expose the drain electrode of the thin film transistor below the insulation layer; and producing a pixel electrode on the insulation layer such that the pixel electrode is electrically connected with the drain electrode of the thin film transistor at the via hole.

In accordance with a further aspect of the present disclosure, there is provided an array substrate including: a base substrate; gate lines formed on the base substrate; and data lines formed on the base substrate and substantially perpendicular to the gate lines; wherein a plurality of pixel regions are delimited by the gate lines and the data lines, each of the plurality of pixel regions at least comprising the pixel unit as described above.

In accordance with a yet further aspect of the present disclosure, there is provided a display apparatus including the array substrate as described above.

Advantageous Effects

From the above technical solutions, it can be seen that the pixel unit and the method for producing the same, the array substrate and the display apparatus at least have the following advantageous effects:

(1) the risk of breakage of the conductive material is reduced when the pixel electrode is overlapped with the drain electrode by adding the elevating layer at the bottom of the via hole to reduce the slope of the via hole;

(2) the elevating layer is made of a portion of the gate metal layer and/or the active layer that is not etched off in processes without increasing any production cost and process difficulty.

BRIEF DESCRIPTION OF THE DRAWINGS

The characteristics and advantages of the present disclosure will become more apparent with reference to figures. Figures given herein are intended to be illustrative, instead of limiting the present disclosure. In the figures.

REFERENCE NUMERALS

| 1 gate line | 2 date line |
|---|---|
| 10 substrate | 20 thin film transistor |
| 21 gate electrode | 22 gate insulation layer |
| 23 active layer | 24 source electrode |
| 25 drain electrode | |
| 30 organic insulation layer | |
| 41 pixel electrode | 43 common electrode |
| 42 passivation layer | 50 via hole |
| 51 first elevating layer | 52 second elevating layer |

DETAILED DESCRIPTION OF PREFERRED EMBODIMENTS OF THE INVENTION

In accordance with a general concept of the present disclosure, a raised or elevating layer may be added at the bottom of or below the via hole to reduce the depth and slope of the via hole, so that the risk of breakage of the conductive material located on the side or wall of the via hole may be reduced when the pixel electrode is overlapped with the drain electrode. The elevating layer may be made of a portion of the gate metal layer and/or the active layer that is not etched off in process without increasing any production cost and process difficulty.

Embodiments of the present invention will be further explained below with reference to the figures and examples. In addition, for the purpose of explanation, numerous specific details are set forth in the following detailed description to provide a thorough understanding to the embodiments of the present invention. It is obvious, however, that one or more embodiments can also be implemented without these specific details. In other instances, well-known structures and devices are shown in an illustrative manner so as to simplify the drawings.

The structure of the pixel unit according to the first embodiment of the present invention will below be described in details with reference to FIG. 3. It should be noted that the pixel unit defined herein does not include the gate lines and date lines.

Figure 3:
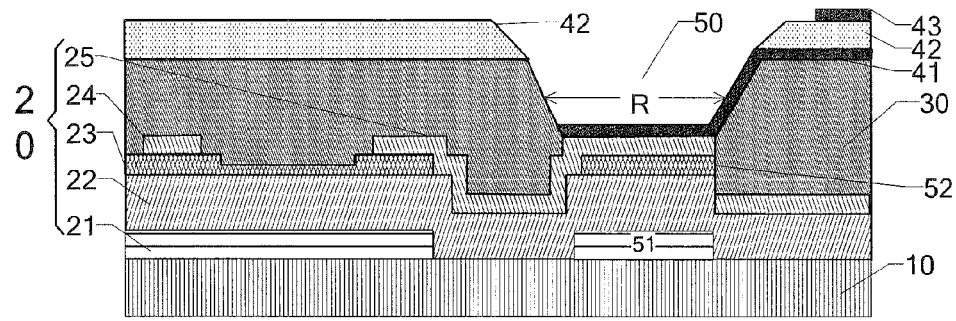
FIG. 3 is a schematic cross sectional view showing a structure of a pixel unit according to a first embodiment of the present invention.

FIG. 3 is a schematic cross sectional view showing a structure of a pixel unit according to a first embodiment of the present invention. As illustrated in FIG. 3, the pixel unit of this embodiment mainly includes a thin film transistor 20, a pixel electrode 41 and a common electrode 43.

In the embodiment shown in FIG. 3, the thin film transistor 20 is a bottom gate type field effect transistor and includes: a gate electrode 21; a gate insulation layer 22 formed on the gate electrode 21; an active layer 23 formed on the gate insulation layer 22; and a source electrode 24 and a drain electrode 25 formed on the active layer 23. In an example, the drain electrode extends to a position below a predetermined via hole position as described below. The gate insulation layer may also extend to a position below the predetermined via hole position. It should be understood that the thin film transistor in the pixel unit may also be a top gate type thin film transistor, which has specific structure known to the skilled person in the art. Therefore, the detailed description for its structure will be omitted below.

In the embodiment, the pixel unit contains an insulation layer at least formed on a drain electrode of the thin film transistor, the insulation layer being formed therein with a via hole. The via hole extends through the insulation layer to expose the drain electrode of the thin film transistor below the insulation layer. In particular, as shown in FIG. 3, an insulation layer 30 overlaps at least the drain electrode of the thin film transistor. In an example, the insulation layer 30 may be an organic insulation layer. The pixel electrode 41 and the common electrode 43 are produced above the organic insulation layer 30 and separated from each other by a passivation layer 42. In an example, the pixel electrode 41 and/or the common electrode 43 are/is transparent electrodes/a transparent electrode, which may be a single layer film of transparent conductive material such as ITO or IZO, or a composite film composed of transparent conductive materials such as ITO or IZO.

As illustrated in FIG. 3, the via hole 50 is formed in the insulation layer 30. The via hole 50 extends through the insulation layer 30 to expose the drain electrode 25 of the thin film transistor. In an example, the via hole 50 is in a shape of inverted truncated cone which has a radial size R decreasing gradually along a depth direction of the via hole. The pixel electrode 41 is electrically connected to the drain electrode 25 of the thin film transistor by a conductive material formed on a side wall of the via hole, or a part of the pixel electrode 41 is formed on the side wall of the via hole to be electrically connected to the drain electrode.

Figure 1:
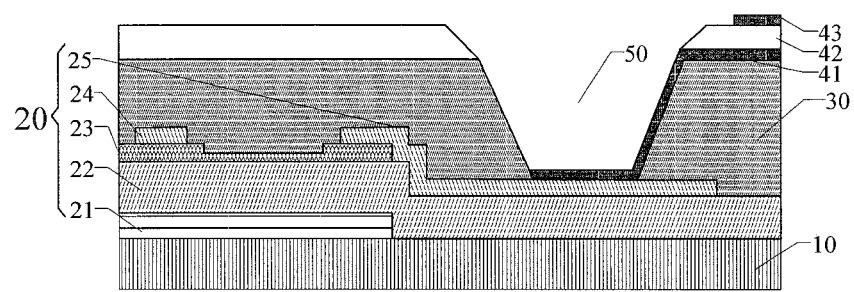
FIG. 1 is a schematic cross sectional view showing a pixel unit on an array substrate in the prior art.
Figure 2:
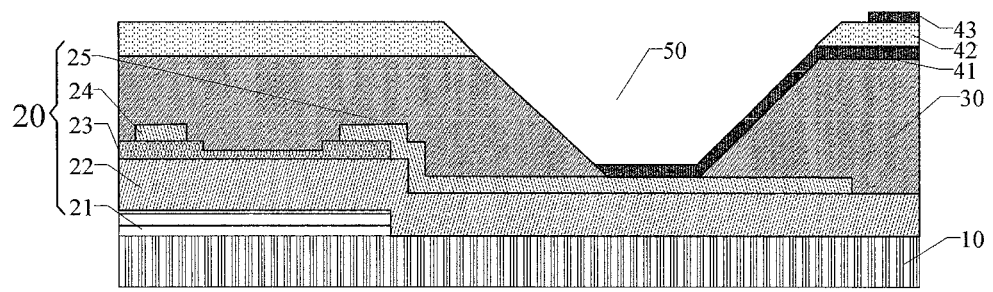
FIG. 2 is a schematic cross sectional view showing a structure of the pixel unit on an array substrate in the prior art after the slope of the via hole is reduced.

In accordance with an embodiment of the present invention, in order to reduce the depth of the via hole, at least one raised or elevating layer may be formed below the via hole. Material layers which are subsequently formed on/above the elevating layer may be raised ol elevated with respect to the arrangement in the prior art, so that the bottom or the lower opening portion of the via hole is raised or elevated with respect to the conventional via hole, as illustrated, that is, the actual depth of the via hole is reduced with respect to the depth of the conventional via hole (which is typically equal to the thickness of the insulation layer, as shown in FIGS. 1 and 2), in other words, a vertical distance H from an upper surface of the part of the drain electrode exposed from the via hole to a face of the insulation layer on which the pixel electrode is formed is smaller than the thickness T of the insulation layer (as shown in FIG. 3), so as to reduce the slope of the via hole. In an example, the at least one elevating layer is formed by one or more material layer forming the thin film transistor, for example, by material layer(s) forming at least one of the gate electrode and the active layer of the thin film transistor. Alternatively, the at least one elevating layer may be formed by different materials separately.

In the example shown in FIG. 3, a first elevating layer 51 and a second elevating layer 52 are arranged below a connection region between the drain electrode 25 and the pixel electrode 41. The second elevating layer 52 is located above the first elevating layer 51. As shown, a part of the drain electrode 25 exposed from the via hole 50 is formed above the elevating layers. Thus, the height of the exposed part is greater than the height of the parts of the drain electrode 25 adjacent to the exposed part, such that the bottom or the lower opening portion of the via hole 50 at the exposed part of the drain electrode 25 is raised or elevated with respect to the conventional via hole, so as to reduce the slope of the via hole.

In an example, the first elevating layer is formed by a gate material remained below the position of the via hole during the process of producing the gate electrode. Further, the first elevating layer 51 only function to raise or elevate layer(s) thereon or thereabove and is not electrically connected to the gate electrode 21 or is electrically insulated from the gate electrode 21. As an example, the second elevating layer 52 is formed by an active material remained below the position of the via hole during the process of producing the active layer. As such, the second elevating layer only functions to raise or elevate layer(s)s thereon or thereabove and is not electrically connected to the active layer 23 or is electrically insulated from the active layer 23.

In an example, the shape of cross sections of the first elevating layer 51 and the second elevating layer 52, i.e., the shape of sections taken along a plane perpendicular to its thickness direction, or the shape of its projection region on the plane perpendicular to its thickness direction, may be designed as required. It may be square, circle, ellipse or the like as long as patterns with corresponding shape can be designed on the corresponding mask. Also, the first elevating layer 51 and the second elevating layer 52 may have the same shape or different shapes.

Refer to FIG. 3, a step is formed between the gate insulation layer 22 and the second elevating layer 52. It is caused by the same shape of cross sections of the first elevating layer 51 and the second elevating layer 52, that is, a projection region of the first elevating layer 51 on a plane perpendicular to its thickness direction and a projection region of the second elevating layer 52 have the same shape, and the radial size of the first elevating layer 51 is greater than the radial size of the second elevating layer 52, i.e., the projection region of the second elevating layer 52 has an area smaller than that of the projection region of the first elevating layer 51. As such, the slope of the drain electrode may be reduced such that the drain electrode is prevented from being broken.

By means of adding the first elevating layer 51 and the second elevating layer 52, the total thickness of film layers located below the via hole may be increased in comparison with the prior arts. When the depth of the via hole is reduced, the reduction in the practical depth is comparable to the total thickness of the gate material layer and the active material layer. Generally, the gate material layer has a thickness of about 0.35 μm and the active material layer has a thickness of about 0.2 μm, thus the depth of the via hole may be reduced to 1.45 μm from 2 μm. As the depth of the via hole 50 is reduced, the slope f the via hole may be reduced correspondingly, so as to reduce the risk of breakage of the pixel electrode efficiently when the pixel electrode overlaps and is connected with the drain electrode. In this way, the planarization of the array substrate may also be improved to reduce or alleviate Rubbing Mura.

It should be noted that in this embodiment, in order to reduce the depth of the via hole as more as possible, the first elevating layer and the second elevating layer are both added below the via hole 50. However, in other embodiments of the present invention, only the first elevating layer or the second elevating layer may be added. In this way, the depth of the via hole may also be reduced and the present disclosure may also be implemented.

Furthermore, the skilled person in the art would appreciate that a separate elevating layer may also be produced below the via hole in addition to the first elevating layer formed along with the gate electrode and the second elevating layer formed along with the active layer. In this way, the via hole may also be elevating to reduce the risk of breakage of the pixel electrode when the pixel electrode overlaps and is connected with the drain electrode. This will also fall with the scope of the present invention.

An embodiment of the present invention also provides a method for producing a pixel unit. The method includes:

forming at least one elevating layer in a region below a predetermined via hole position of the pixel unit;

producing a drain electrode of the thin film transistor, a part of the drain electrode being formed above the at least one elevating layer such that the part of the drain electrode has a height greater than that of its adjacent parts of the drain electrode;

forming an insulation layer at least above the drain electrode of the thin film transistor and forming a via hole in the insulation layer at a position corresponding to the predetermined via hole position, the via hole extending through the insulation layer to expose the drain electrode of the thin film transistor below the insulation layer; and producing a pixel electrode on the insulation layer such that the pixel electrode is electrically connected to the drain electrode of the thin film transistor at the via hole.

In an example, the at least one elevating layer is formed at the time a material layer, from which at least one of a gate electrode and an active layer of the thin film transistor is made, is formed.

Figure 4:
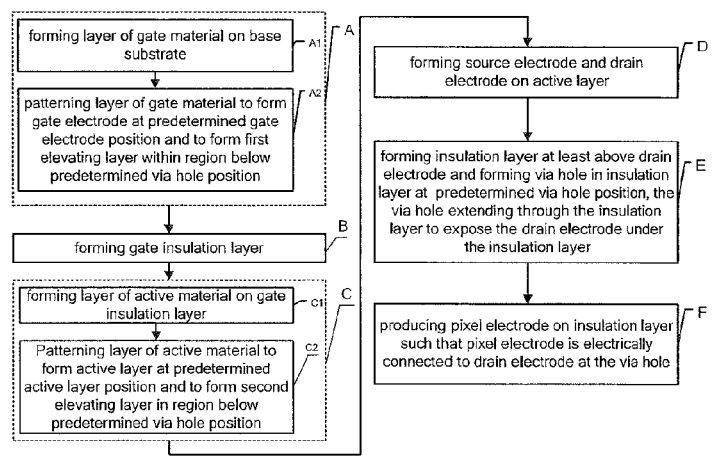
FIG. 4 is a flow chart showing a method for producing a pixel unit according to a second embodiment of the present invention.

FIG. 4 is a flow chart showing a method for producing a pixel unit according to a second embodiment of the present invention. With reference to FIGS. 3 and 4, the method of the embodiment mainly includes the following steps A to F.

In the step A, the gate electrode 21 is formed on a base substrate 10 and a first elevating layer 51 is formed in the region of the pixel unit below the predetermined via hole position.

In an example, the step A may include:

sub-step A1: forming a layer of gate material on the base substrate 10; and sub-step A2: patterning the layer of gate material to form the gate electrode 21 at a predetermined gate electrode position and to form the first elevating layer 51 within the region below the predetermined via hole position.

In the sub-step A2, the patterning may include:

forming a photoresist layer on the gate material layer;

exposing the photoresist layer to light and developing the exposed photoresist layer with a gate mask so that the photoresist layer is remained at a predetermined gate electrode position and in the region just below the predetermined via hole position, wherein the gate mask used herein is different from the conventional gate mask; if the photoresist layer is exposed to light with the conventional gate mask and developed, only the photoresist layer at the gate electrode position will be remained; in contrast, in this embodiment, after the photoresist layer is exposed to light with the gate mask and developed, the photoresist layer located both at the gate electrode position and in the region below the predetermined via hole position is remained;

etching the layer of gate material with the remained photoresist layer as a mask, so that due to the protection of the photoresist, the gate material is remained at the predetermined gate electrode position and in the region just below the predetermined via hole position, wherein the gate material remained at the predetermined gate electrode position forms the gate electrode 21 and the gate material remained in the region below the predetermined via hole position forms the first elevating layer 51, the first elevating layer 51 being not electrically connected to the first elevating layer 51; and removing residual photoresist layer.

In the step B, a gate insulation layer 22 is formed on the gate electrode 21.

The step for forming the gate insulation layer does coincide with the corresponding step in the prior art. The details will be omitted below.

In the step C, an active layer 23 and a second elevating layer 52 are formed on the gate insulation layer 22, the second elevating layer 22 being located in the region below the predetermined via hole position.

In an example, the step C specifically includes:

sub-step C1: depositing a layer of active material on the gate insulation layer 22; and sub-step C2: patterning the layer active material to form the active layer 23 at a predetermined active layer position and to form the second elevating layer 52 in the region below the predetermined via hole position.

In the sub-step C2, the patterning may include:

forming a photoresist layer on the layer active material;

exposing the photoresist layer to light with an active mask and developing the exposed photoresist layer so that the photoresist layer is remained at the predetermined active layer position and in the region below the predetermined via hole position, wherein the active mask used herein is different from the conventional active mask; if the photoresist layer is exposed to light with the conventional active mask and developed, the photoresist layer will be remained only at the active layer position; in contrast, in this embodiment, after the photoresist layer is exposed to light with the active mask and developed, the photoresist layer located both at the active layer position and in the region below the predetermined via hole is remained;

etching the layer of active material with the remained photoresist layer as a mask, so that due to the protection of the photoresist, the active material is remained at the predetermined active layer position and in the region below the predetermined via hole position, wherein the active material remained at the predetermined active layer position forms the active layer 23 and the active material remained in the region below the via hole position forms the second elevating layer 52, the second elevating layer 52 being not electrically connected to the active layer 23; and removing residual photoresist layer.

In the step D, source electrodes 24 and 25 are formed on the active layer 23 such that a part of the drain electrode 25 is formed above the second elevating layer 52.

In the step E, an organic insulation layer 30 is formed at least above the drain electrode of the thin film transistor, the insulation layer is formed therein with a via hole 50, which extends through the insulation layer 30 to expose the drain electrode 25 of the thin film transistor below the insulation layer.

In the step F, a pixel electrode 41 is formed on the insulation layer 30 and electrically connected to the drain electrode 25 of the thin film transistor at the via hole 50.

In an example, the step F may include:

sub-step F1: depositing a layer of pixel electrode material;

As discussed above, the pixel electrode 41 may be a single layer film of transparent conductive material such as ITO or IZO, or a composite film composed of transparent conductive materials such as ITO or IZO and depositing the pixel electrode layer is typically implemented through a magnetron sputtering process;

sub-step F2: performing a patterning process such that the pixel electrode material is remained at the via hole position, the predetermined pixel electrode position and the overlapped position therebetween to form the pixel electrode and electrically connect it with the drain electrode of the thin film transistor 20.

As the first elevating layer 51 and the second elevating layer 52 are added below the via hole 50, the bottom or lower opening portion of the via hole is elevating and the depth and the slope of the via hole are reduced. Generally, the gate material layer has a thickness of about 0.35 µm and the active material layer has a thickness of about 0.2 µm, thus the depth of the via hole may be reduced to 1.45 µm from 2 µm. Thus, the conductive material between the pixel electrode and the via hole position has a good bonding force to the organic insulation layer, so as to reduce the risk of breakage of the pixel electrode and the drain electrode efficiently when they are overlapped and connected with each other.

The step F may also include sub-step F3 of forming the passivation layer 42 and the common electrode 43 subsequently on the pixel electrode 41.

In this embodiment, by means of adding the first elevating layer 51 and the second elevating layer 52 to raise the bottom or the lower opening portion of the via hole and to reduce the depth and the slope of the via hole, the risk of breakage of the conductive material connecting the pixel electrode with the drain electrode may be reduced efficiently and the planarization of the array substrate may also be improved to reduce Rubbing Mura. Meanwhile, on the basis of the conventional process flow, only two masks, i.e., the gate mask and the active mask, need to be replaced without changing any other processes and without adding any product costs and processing difficulty. It is easier to be accepted by the industry.

It should be noted that, in this embodiment, the order of the above steps are not intended to be limited by the order listed above and may be changed or rearranged as required, unless certain steps are described specially or must be carried out in sequence.

Figure 5:
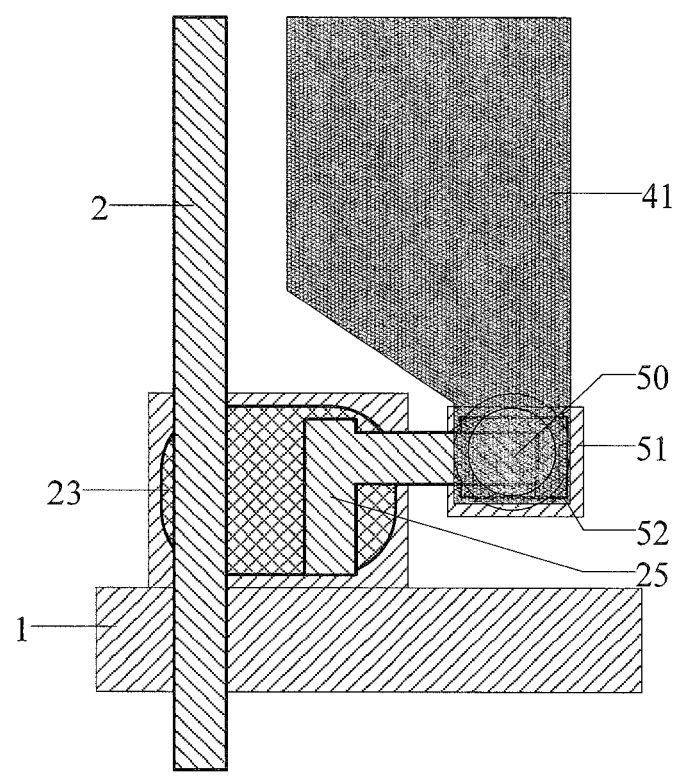
FIG. 5 is a top view showing an array substrate according to a third embodiment of the present invention.

FIG. 5 is a top view showing an array substrate according to a third embodiment of the present invention. For the sake of explication to the present embodiment, the passivation layer and the common electrode above the pixel electrode are omitted.

As illustrated in FIG. 5, the array substrate includes: a base substrate, for example glass substrate; gate lines 1 formed on the base substrate; and data lines 2 formed on the base substrate and substantially perpendicular to the gate lines 1. A plurality of pixel regions are delimited by the gate lines 1 and the data lines 2. Each of the plurality of pixel regions includes the pixel unit shown in FIG. 3 and described in the first embodiment.

In the pixel unit, the gate electrode of the thin film transistor is connected to the gate line and the source electrode of the thin film transistor is connected to the date line.

As an example, on the array substrate in the embodiment, gate lines are provided both above and below a plurality of pixel units in each row and data lines are provided on both left side and the right side of each pixel unit. And only one gate line is provided between every two rows of adjacent pixel units and only one date line is provided between every two columns of adjacent pixel units. In comparison with the conventional array substrate in the prior arts, the array substrate in the embodiment is characterized in that the pixel unit is a pixel unit as described in the first embodiment of the present disclosure.

Alternatively, on the array substrate in the embodiment, gate lines are provided both above and below a plurality of pixel units in each row and two gate lines are provided between each two rows of adjacent pixel units. Data lines are provided on the left side or the right side of each column of pixel units and two date lines are provided between every two columns of adjacent pixel units. It may achieve an array substrate with double gate structure on the basis of the ADS display mode. In comparison with the conventional array substrate in the prior arts, the array substrate in the embodiment is characterized in that the pixel unit is a pixel unit as described in the first embodiment of the present disclosure.

In a fourth embodiment, there is provided a display apparatus. The display apparatus includes an array substrate; an opposite substrate arranged opposite to the array substrate; and a liquid crystal layer filled between the array substrate and the opposite substrate. The array substrate of the display apparatus is the array substrate as described in the third embodiment and one of the array substrate and the opposite substrate is provided with a color filter thereon.

In a fifth embodiment, there is also provided an array substrate. The array substrate is distinguished from that of the third embodiment in that it is an array substrate based on OLED technology. In particular, in the pixel unit, the common electrode and the pixel electrode are not separated from each other by the passivation layer, while an organic emitting layer is provided. In case that the common electrode and the pixel electrode are applied with voltages, the organic light emitting layer may emit light with predetermined color and gray-scale.

In a sixth embodiment, there is also provided a display apparatus. The display apparatus includes the array substrate as described in the fifth embodiment; and a cover plate fixed above the array substrate.

In addition, the description for the above elements and steps are not limited to various specific structures, shapes or means. The skilled person in the art may replace or modify them simply, for example:

(1) an insulation layer made from $SiN_x$ material is also applied to the present disclosure;
(2) In the array substrate, any transparent base substrate other than the glass substrate may also be used;
(3) In addition to the first elevating layer formed along with the gate electrode and the second elevating layer formed along with the active layer, a separate elevating layer may also be produced below the via hole;
(4) examples of parameters including special values may be provided herein, however, these parameters need not to be equal to the corresponding values exactly, but may approximate to the corresponding value in an acceptable error limit or design constraint;
(5) The directional terms used in the embodiments, such as "up", "down", "front", "back", "left", "right", only indicate the directions shown in the figures, instead of limiting the protect scope of the present invention.

In summary, in the embodiments of the present invention, the elevating layer is added below the via hole, for example, the elevating layer (a separate structure not being connected to the gate electrode and the active layer of the thin film transistor) made from the material for forming at least one of the gate electrode and the active layer, such that the height of the bottom of the via hole is elevating to reduce the actual or effective depth and slope of the via hole and reduce the risk of breakage of the pixel electrode when it overlaps and is connected with the drain electrode, thereby improving the planarization of the array substrate and reduce Rubbing Mura. The embodiments of the present invention may improve quality of product efficiently without adding any production costs and process difficulty and thus are applicable widely.

With the above embodiments of the present invention, the objects, solutions and advantageous effects of the present application have been described in details. It should be understood that the above embodiments are only examples of the present application, instead of limiting the present application. Any alternations, equivalents and modifications without departing from the spirit and principle of the present application will fall within the scope of the present application.

What is claimed is:
1. A pixel unit, comprising:
a thin film transistor;
an insulation layer, formed at least on a drain electrode of the thin film transistor, the insulation layer being formed therein with a via hole which extends through the insulation layer to expose the drain electrode of the thin film transistor under the insulation layer;
a pixel electrode formed on the insulation layer and electrically connected to the drain electrode of the thin film transistor at the via hole; and
at least one elevating layer formed below the via hole and located below a part of the drain electrode exposed from the via hole such that:
the exposed part has a height greater than the height of parts of the drain electrode immediately adjacent to the exposed part;
the exposed part covers the at least one elevating layer so as to avoid the at least one elevating layer from being exposed from the via hole; and a distance by which the pixel electrode extends vertically within the via hole is smaller than a thickness of a portion of the insulation layer adjacent to the via hole,
wherein the thin film transistor is a bottom gate type field effect transistor, comprising:
a gate electrode;
a gate insulation layer formed on the gate electrode;
an active layer formed on the gate insulation layer; and
a source electrode and a drain electrode formed on the active layer; and
wherein the at least one elevating layer comprises:
a first elevating layer formed by a gate material from which the gate electrode is made and insulated electrically from the gate electrode: and
a second elevating layer formed by an active material from which the active layer is made and insulated electrically from the active layer, the second elevating layer being located above the first elevating layer,
a projection region of first elevating and a projection region of the second elevating layer on a plane perpendicular to their thickness direction have the same shape, and the projection region of the second elevating layer has an area smaller than that of the projection region of the first elevating laver.

2. The pixel unit according to claim 1, wherein a shape of a projection region of the at least one elevating layer on a plane perpendicular to its thickness direction is selected from a group consisting of a square, a circle and an ellipse.

3. The pixel unit according to claim 1, wherein the via hole is in a shape of inverted truncated cone which has a radial size decreasing gradually along a depth direction the via hole; and
wherein the pixel electrode is electrically connected to the drain electrode of the thin film transistor by a conductive material formed on a side wall of the via hole, or a part of the pixel electrode is formed on the side wall of the via hole to be electrically connected to the exposed part of the drain electrode.

4. The pixel unit according to claim 1, wherein the insulation layer is an organic insulation layer or an inorganic insulation layer.

5. An array substrate, comprising:
a base substrate;
gate lines formed on the base substrate; and
data lines formed on the base substrate and substantially perpendicular to the gate lines;
wherein a plurality of pixel regions are delimited by the gate lines and the data lines, each of the plurality of pixel regions at least comprising the pixel unit according to claim 1.

6. A display apparatus, comprising the array substrate according to claim 5.

7. The display apparatus according to claim 6, further comprising:
an opposite substrate arranged opposite to the array substrate; and
a liquid crystal layer filled between the array substrate and the opposite substrate; and
wherein the pixel unit further comprises a common electrode arranged above the pixel electrode, and the common electrode and the pixel electrode are separated from each other by a passivation layer.

8. The display apparatus according to claim 6, further comprising a cover plate covering the array substrate from above; and
wherein the pixel unit further comprises:
a common electrode formed on the pixel electrode and located between the cover plate and the pixel electrode; and
an organic light emitting layer located between the pixel electrode and the common electrode.

9. A method for producing a pixel unit, comprising steps of:
forming at least one elevating layer in a region below a predetermined via hole position of the pixel unit;
producing a drain electrode of a thin film transistor, a part of the drain electrode being formed above the at least one elevating layer such that the part of the drain electrode has a height greater than that of parts of the drain electrode immediately adjacent to the part;
forming an insulation layer at least above the drain electrode of the thin film transistor and forming a via hole in the insulation layer at a position corresponding to the predetermined via hole position, the via hole extending through the insulation layer to expose a part of the drain electrode of the thin film transistor under the insulation layer; and
producing a pixel electrode on the insulation layer such that the pixel electrode is electrically connected to the exposed part of the drain electrode of the thin film transistor at the via hole and that the exposed part covers above the at least one elevating layer so as to avoid the at least one elevating layer from being exposed from the via hole, a distance by which the pixel electrode extends vertically within the via hole being smaller than a thickness of a portion of the insulation layer adjacent to the via hole,
wherein the method further comprises steps of producing the thin film transistor, and the steps of producing the thin film transistor and the step of forming the at least one elevating layer comprise:
step A: simultaneously forming a gate electrode of the thin film transistor and a first elevating layer on a base substrate such that the first elevating layer is formed by a gate electrode material from which the late electrode is made, the first elevating layer being electrically insulated from the gate electrode;
step B: forming a gate insulation layer on the gate electrode and the first elevating layer;
step C: simultaneously forming an active layer and a second elevating layer on the gate insulation layer such that the second elevating layer is formed by an active material from which the active layer is made, the second elevating layer being located above the first elevating layer and electrically insulated from the active layer; and
step D: forming a source electrode and the drain electrode of the thin film transistor on the active layer, a part of the drain electrode being formed above the second elevating layer,
wherein a projection region of the first elevating layer and a projection region of the second elevating layer on a plane perpendicular to their thickness direction have the same shape, and the projection region of the second elevating layer has an area smaller than that of the projection region of the first elevating layer.

10. The method according to claim 9, wherein the Step A comprises:
sub-step A1: forming a layer of gate material on the base substrate; and
sub-step A2: patterning the layer of gate material to form the gate electrode at a predetermined gate electrode position and to form the first elevating layer within a region below the predetermined via hole position.

11. The method according to claim 10, wherein the sub-step A2 comprises:

forming a photoresist layer on the layer of gate material;

exposing the photoresist layer to light and developing the exposed photoresist layer such that the photoresist layer is remained at the predetermined gate electrode position and in the region just below the predetermined via hole position;

etching the gate material layer with the remained photoresist layer as a mask such that the gate material is remained at the predetermined gate electrode position and in the region just below the predetermined via hole position, wherein the gate material remained at the predetermined gate electrode position forms the gate electrode and the gate material remained in the region below the predetermined via hole position forms the first elevating layer; and removing residual photoresist layer.

12. The method according to claim 9, wherein the step C comprises:

sub-step C1: depositing a layer of active material on the gate insulation layer; and sub-step C2: patterning the layer of active material to form the active layer at the predetermined active layer position and to form the second elevating layer in the region below the predetermined via hole position.

13. The method according to claim 12, wherein the sub-step C2 comprises:

forming a photoresist layer on the layer of active material;

exposing the photoresist layer to light and developing the exposed photoresist layer such that the photoresist layer is remained at the predetermined active layer position and in the region below the predetermined via hole position;

etching the layer of active material with the remained photoresist layer as a mask such that the active material is remained at the predetermined active layer position and in the region below the predetermined via hole position, wherein the active material remained at the predetermined active layer position forms the active layer and the active material remained in the region below the via hole position forms the second elevating layer; and removing residual photoresist layer.

* * * * *